(12) United States Patent
McAlonis et al.

(10) Patent No.: US 7,525,818 B1
(45) Date of Patent: Apr. 28, 2009

(54) MEMORY CARD CONNECTOR WITH EMI SHIELDING

(75) Inventors: Matthew Richard McAlonis, Elizabethtown, PA (US); Lynn Robert Sipe, Mifflintown, PA (US); James Lee Fedder, Etters, PA (US)

(73) Assignee: Tyco Electronics Corporation, Middletown, PA (US)

( * ) Notice: Subject to any disclaimer, the term of this patent is extended or adjusted under 35 U.S.C. 154(b) by 0 days.

(21) Appl. No.: 11/972,956

(22) Filed: Jan. 11, 2008

(51) Int. Cl.
*H05K 9/00* (2006.01)

(52) U.S. Cl. ................ 361/818; 361/728; 361/730; 361/752; 361/753

(58) Field of Classification Search ........... 361/818, 361/728, 730, 752, 753
See application file for complete search history.

(56) References Cited

U.S. PATENT DOCUMENTS

| | | | |
|---|---|---|---|
| 5,281,169 A * | 1/1994 | Kiat et al. ............ 439/607 |
| 6,095,862 A | 8/2000 | Doye et al. | |
| 6,267,606 B1 * | 7/2001 | Poplawski et al. ........... 439/92 |
| 6,447,313 B1 * | 9/2002 | Zuin ............... 439/159 |
| 6,604,955 B2 * | 8/2003 | Dawson et al. ............ 439/181 |
| 6,607,308 B2 * | 8/2003 | Dair et al. ............ 385/92 |
| 6,893,168 B2 * | 5/2005 | Huang et al. .............. 385/92 |
| 7,001,217 B2 | 2/2006 | Bright et al. | |
| 7,150,644 B2 * | 12/2006 | Behl ............ 439/374 |
| 7,380,995 B2 * | 6/2008 | Chan ............ 385/92 |
| 7,393,221 B2 * | 7/2008 | Feng et al. ............. 439/159 |

* cited by examiner

*Primary Examiner*—Dean A. Reichard
*Assistant Examiner*—Xiaoliang Chen (57) ABSTRACT

A memory card connector assembly for use within a chassis includes a conductive shell that has a forward perimeter. A connector including a dielectric housing holding contacts is positioned within the shell. An EMI shielding member is disposed on the forward perimeter of the shell. The EMI shielding member is configured to engage a panel of the chassis to suppress the escape of EMI energy from the chassis.

18 Claims, 9 Drawing Sheets

MEMORY CARD CONNECTOR WITH EMI SHIELDING

BACKGROUND OF THE INVENTION

The invention relates generally to electrical connectors and, more particularly, to a connector assembly having features for inhibiting electromagnetic emissions.

Electromagnetic interference (EMI) is commonly encountered in the operation of electronic systems. EMI can cause electronic equipment to malfunction when the equipment is not sufficiently shielded. EMI becomes more problematic as processing speeds increase. Some electronic devices may be mounted on or adjacent to a panel inside a chassis or cabinet. In the cabinet, doors and seams are sources for the escape of radiation or electromagnetic energy from the cabinet that may cause electromagnetic interference. The leak or escape of radiation from the cabinet may be monitored and may be subject to FCC regulation.

Compressive gaskets are commonly applied around connections between electrical components to suppress EMI. In addition to being compressible, the gasket is intended to provide conductivity to ensure electrical continuity between mating surfaces of the components. However, tolerances associated with the positioning of connectors on the panel require that the gasket have a deflection range sufficient to effectively seal against EMI leakage between the connector and the panel. Some known gaskets are made from a conductive elastomer, which is inserted into a channel between two mating surfaces. In addition, the gasket may be glued to the inside of the channel. In such arrangements, the channel is used to provide lateral stability for the gasket and to prevent misalignment that could result over time from the repeated separation of the components. In another known shielding method, a compressible gasket is formed from a conductive metal and attached to a metal band along its length. The metal band is sandwiched between the mating surfaces of the components when the components are mated.

With the ongoing trend toward the development of smaller components, such as the newer secure digital (SD) memory card form factor, less space or structure is available on the connectors for features such as EMI suppression. SD memory card connectors are typically designed with a conductive shield and may have grounding tabs or pads that may be connected to a ground plane on a circuit board. However, a space may still be present between the connector and a panel which may allow EMI radiation or energy to escape from the cabinet. For instance, the panel may be a chassis or cabinet wall that is integral with the chassis bottom or floor, usually with a right angle bend. There are angular tolerances associated with the bend. The connector may be mounted on a circuit board that is aligned with standoffs on the chassis floor. There are tolerances associated with the location of the standoffs on the chassis floor as well as the position of the circuit board on the standoffs and the connector on the circuit board. As a result, there is a tolerance accumulation between an edge of the circuit board and the panel that produces a space between the connector and the panel through which EMI emissions may escape from the chassis. Thus, the effective suppression of electromagnetic emissions remains a challenge.

BRIEF DESCRIPTION OF THE INVENTION

In one embodiment, a memory card connector assembly for use within a chassis is provided. The connector assembly includes a conductive shell that has a forward perimeter. A connector including a dielectric housing is positioned within the shell. An EMI shielding member is disposed on the forward perimeter of the shell. The EMI shielding member is configured to engage a panel of the chassis to suppress the escape of EMI energy from the chassis.

Optionally, the connector includes a plurality of contacts proximate a rearward end of the connector to electrically connect the connector to a circuit board mounted within the chassis. The EMI shielding member comprises a plurality of flexible fingers that may be formed integrally with the panels. A portion of the shell and a portion of the EMI shielding member may be configured to partially protrude through an opening in the panel of the chassis. Alternatively, the EMI shielding member may be configured to engage a rearward surface of the panel of the chassis. The shell defines a recess for finger access to the memory card.

In another embodiment, a memory card connector assembly for use within a chassis is provided. The connector assembly includes a conductive shell that has a forward perimeter. A connector including a dielectric housing is positioned within the shell. The connector has a memory card opening that is at least partially defined by the shell. An EMI shielding member is disposed on the forward perimeter of the shell. The EMI shielding member is configured to engage a panel of the chassis to suppress the escape of EMI energy from the chassis.

DETAILED DESCRIPTION OF THE INVENTION

Figure 1:
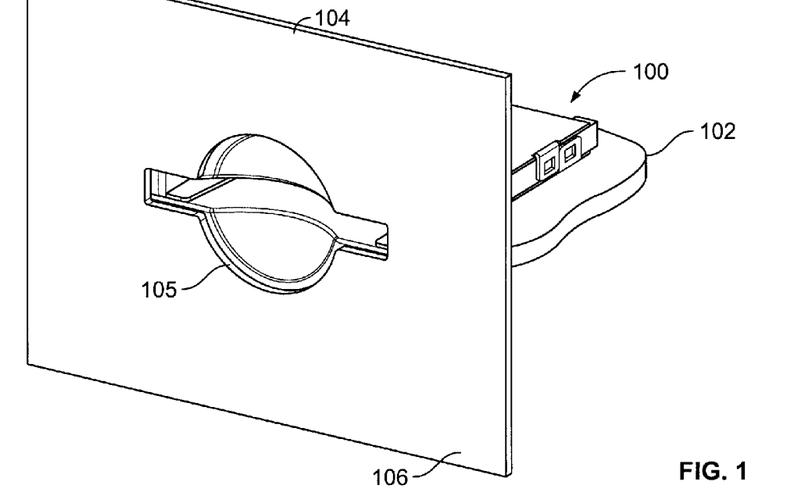
FIG. 1 is a front perspective view of a connector assembly formed in accordance with an exemplary embodiment of the present invention.
Figure 2:
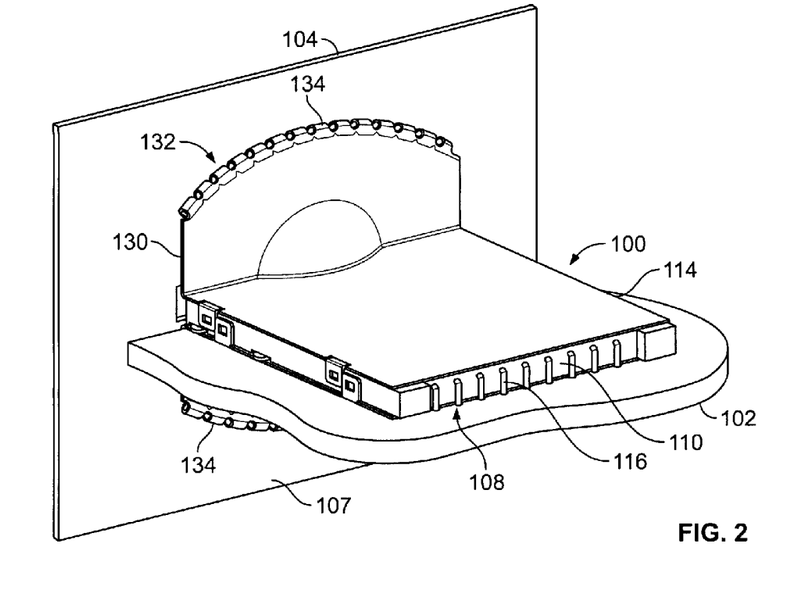
FIG. 2 is a rear perspective view the connector assembly shown in FIG. 1.

FIG. 1 illustrates a front perspective view of a connector assembly 100 formed in accordance with an exemplary embodiment of the present invention. FIG. 2 illustrates a rear perspective view the connector assembly 100. The connector assembly 100 is mounted on a circuit board 102 and is positioned adjacent a conductive panel 104 that includes an opening 105 through which a memory card (not shown) may be inserted into and extracted from the connector assembly 100. The invention will be described in terms of a memory card connector that is designed, for instance, for use with a secure digital (SD) memory card. Such description is presented for purposes of illustration only and no limitation is intended thereby. The panel 104 may represent a wall of a chassis (not shown) within which the connector assembly 100 is installed. The panel 104 includes a front or outer surface 106 and a rear or inner surface 107.

Figure 3:
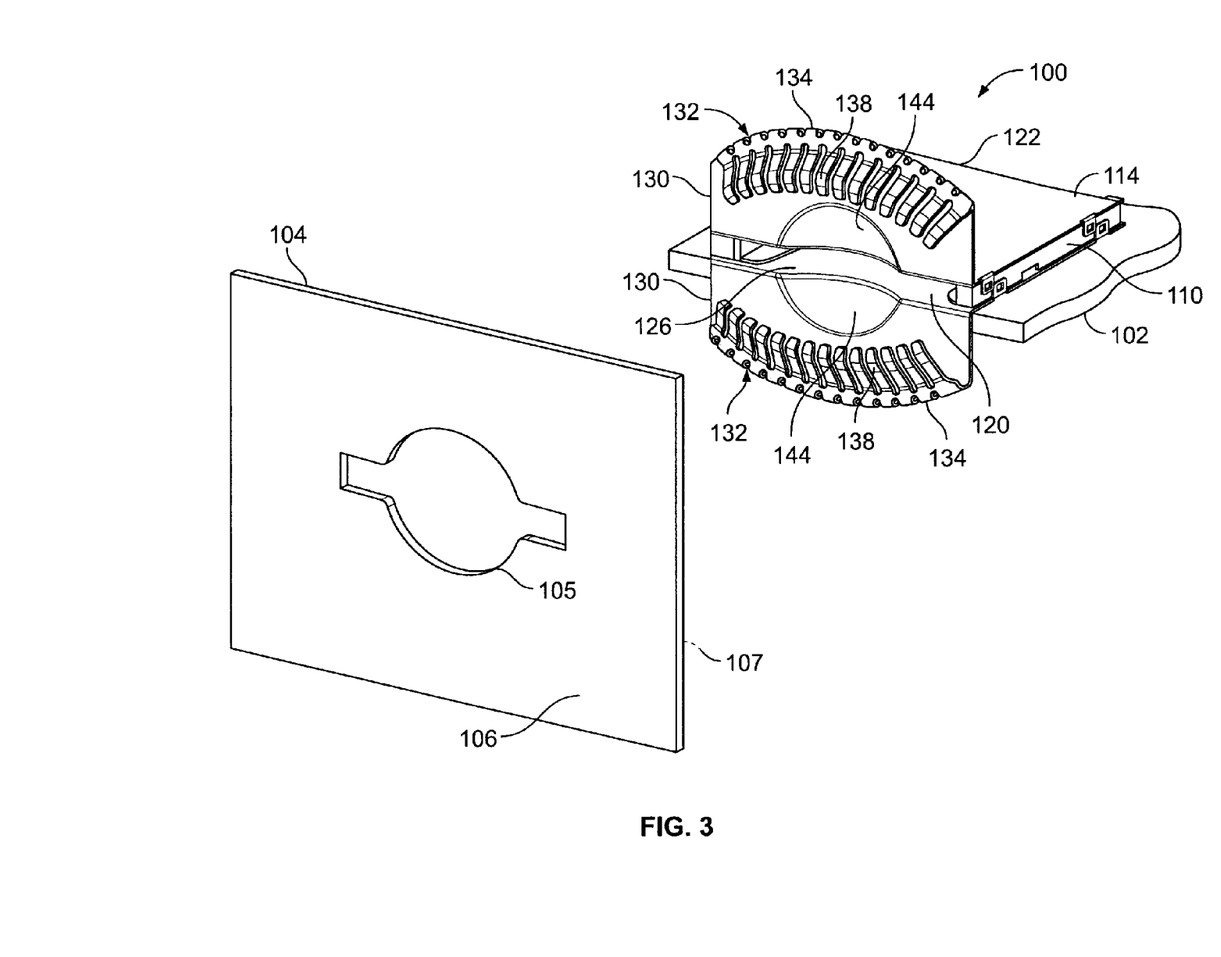
FIG. 3 is a perspective view of the connector assembly shown in FIG. 1 displaced from the panel.

With continued reference to FIGS. 1 and 2, FIG. 3 illustrates a perspective view of the connector assembly 100 displaced from the panel 104. The connector assembly 100 includes a connector 108 comprising a dielectric housing 110 that is held in a conductive shell 114. The housing 110 holds a plurality of electrical contacts 116 that electrically connect the connector 108 to the circuit board 102. The shell 114 is electrically connected to a ground plane (not shown) on the circuit board 102. The connector 108 includes a forward end 120 and a rearward end 122 opposite the forward end 120. An opening 126 proximate the forward end 120 is provided to receive a memory card (not shown). The opening 126 is at least partially defined by the shell 114.

The shell 114 includes flanges 130 proximate the forward end 120 of the connector 108. An EMI shielding member 132 is formed about a forward perimeter 134 of each flange 130. In an exemplary embodiment, the EMI shielding member 132 includes a plurality of flexible fingers 138 formed on the forward perimeter 134 of the flanges 130. In one embodiment, the flexible fingers 138 may be formed integrally with the flanges 130. In other embodiments, the fingers 138 may be formed as a separate component that may be mounted on the forward perimeter 134 of the flanges 130. The flexible fingers 138 are configured to engage the inner surface 107 of the panel 104 proximate the panel opening 105 to suppress the escape of EMI energy from inside the chassis (not shown) through the panel opening 105. Each flange 130 includes a recess or finger access depression in the form of an outwardly belled concave portion 144 that is provided to allow finger access to a memory card (not shown) in the connector 108.

Figure 4:
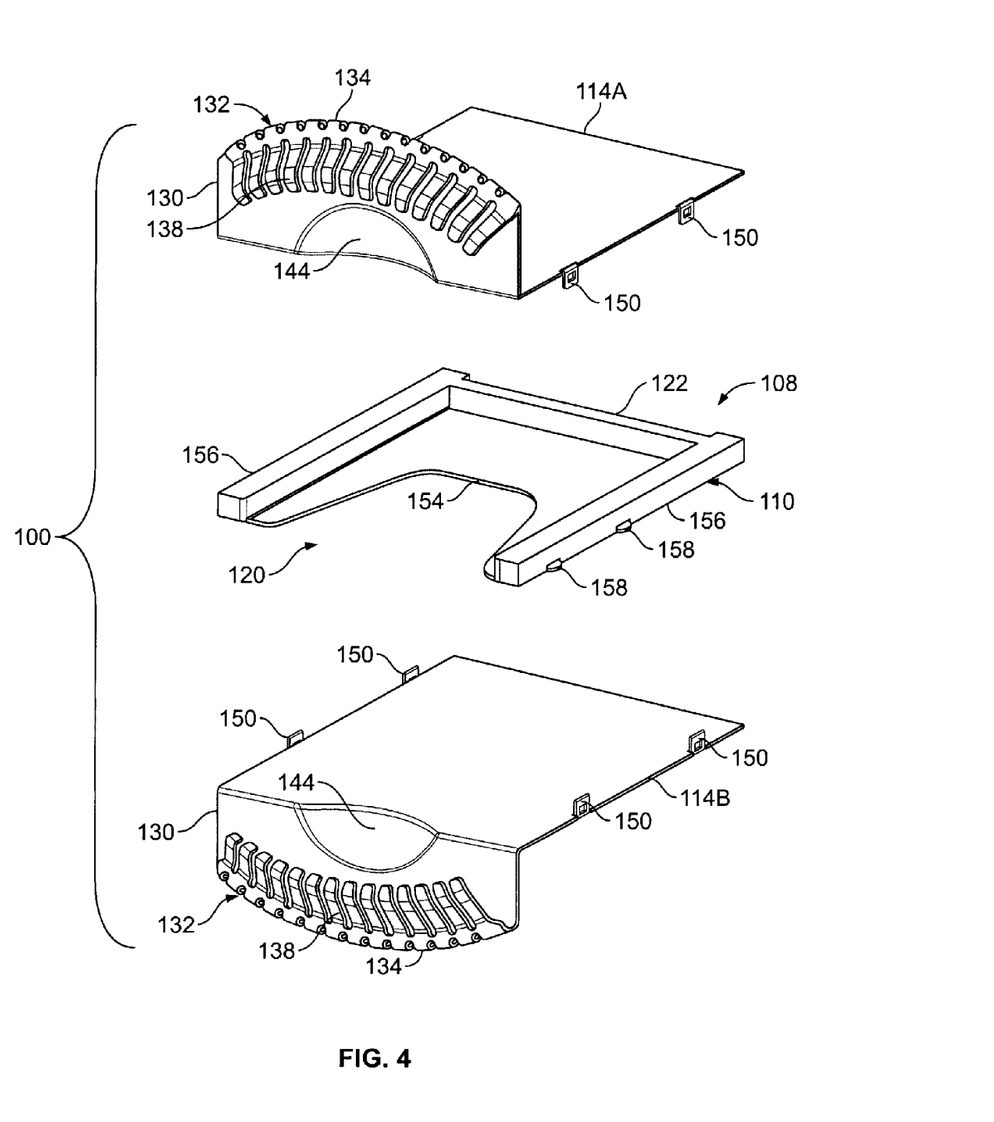
FIG. 4 is an exploded view of the connector assembly shown in FIG. 3.

FIG. 4 illustrates an exploded view of the connector assembly 100. The shell 114 (see FIG. 3) comprises an upper shell panel 114A and a lower shell panel 114B both being formed from a conductive material and positioned substantially parallel to one another. In an exemplary embodiment, the upper and lower shell panels 114A and 114B are identical to one another. In one embodiment, each upper and lower shell panel 114A and 114B includes clips 150 positioned on each shell panel 114A and 114B so that when the upper and lower shell panels 114A and 114B are joined, corresponding clips 150 engage one another to latch the upper and lower shell panels 114A and 114B together forming the shell 114. Each upper and lower shell panel 114A and 114B includes a flange 130 that is formed substantially perpendicular to the upper and lower shell panels 114A and 114B.

The connector housing 110 includes a base 154 and opposite sides 156. In some embodiments, the housing 110 may include mechanical components (not shown) such as a latch and eject mechanism for handling the memory card (not shown) according to known methods. More specifically, the housing 110 may include a push-push ejection mechanism whereby the memory card is pushed into the connector 108 and then pushed again triggering the mechanism to eject the memory card from the connector 108. In other embodiments, the memory card may be manipulated completely by the hand of the user. The housing 110 may also include electrical connections (not shown) such as contacts configured to electrically engage the memory card. Grounding tabs 158 are provided along the sides 156 that may used for making ground connections to a ground plane on the circuit board 102 (FIG. 3). In one embodiment, the grounding tabs 158 are soldered to the circuit board 102. When assembled, the connector 108 is sandwiched between the upper and lower shell panels 114A and 114B.

Figure 5:
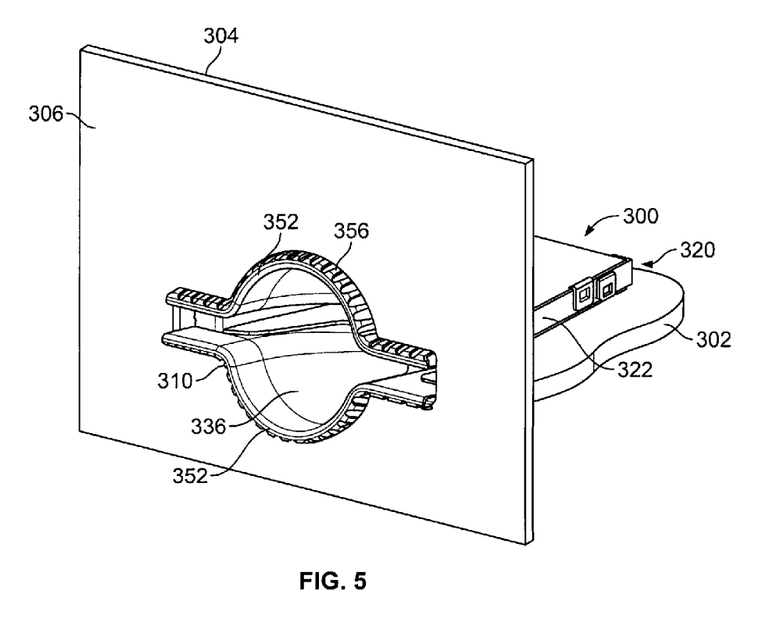
FIG. 5 is a perspective view the connector assembly formed in accordance with an alternative embodiment of the present invention.
Figure 6:
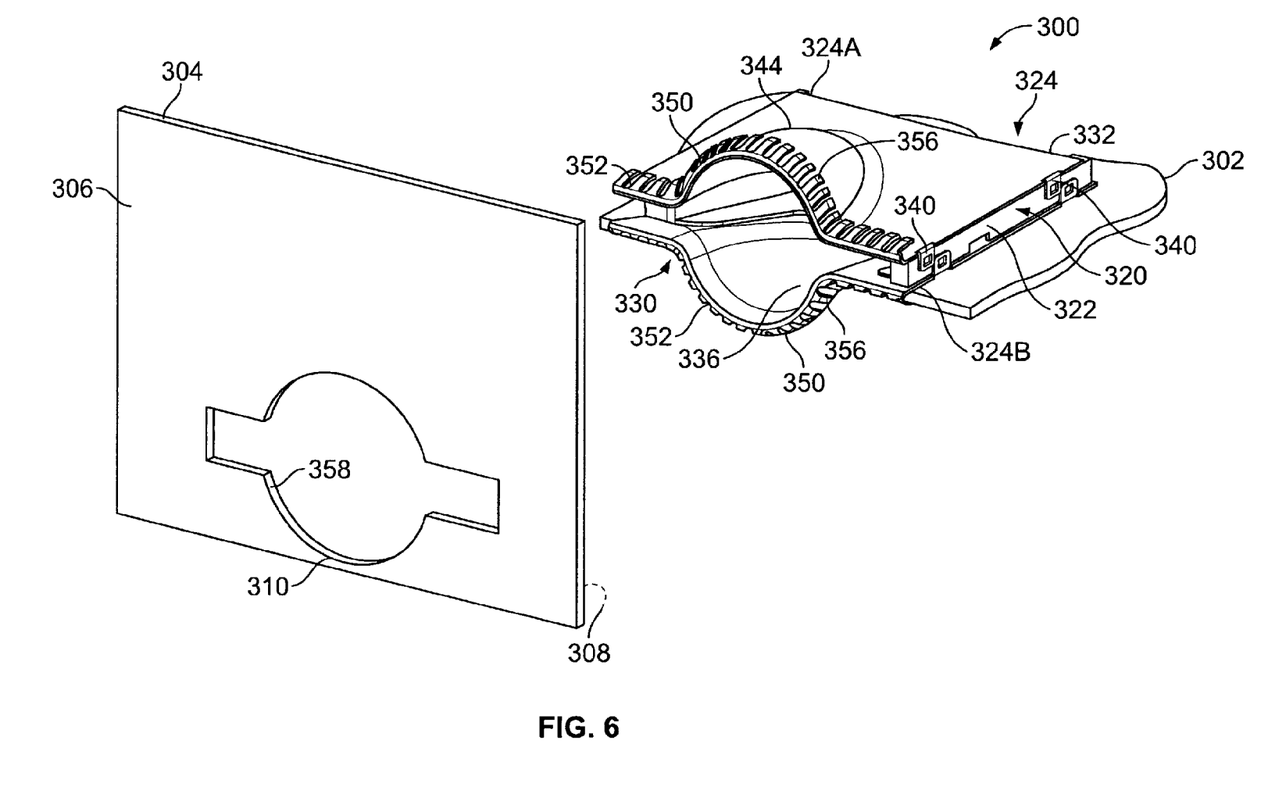
FIG. 6 is a perspective view of the connector assembly shown in FIG. 5 displaced from the panel.

FIG. 5 illustrates a perspective view a connector assembly 300 formed in accordance with an alternative embodiment of the present invention. The connector assembly 300 is mounted on a circuit board 302 and is positioned adjacent a conductive panel 304. FIG. 6 illustrates a perspective view of the connector assembly 300 displaced from the panel 304. The panel 304 has an outer surface 306, an inner surface 308, and an opening 310 therethrough. A memory card (not shown) may be inserted into and extracted from the connector assembly 300 through the panel opening 310. As with the previously described embodiment, the panel 304 may represent a wall of a chassis (not shown) within which the connector assembly 300 is installed.

The connector assembly 300 includes a connector 320 comprising a dielectric housing 322 that is held in a conductive shell 324. The housing 322 holds a plurality of electrical contacts (not shown) that electrically connect the connector 320 to the circuit board 302. The shell 324 is electrically connected to a ground plane (not shown) on the circuit board 302. The connector 320 includes a forward end 330 and a rearward end 332 opposite the forward end 330. An opening 336 proximate the forward end 332 is provided to receive a memory card (not shown). The opening 336 is at least partially defined by the shell 324. Other aspects of the connector 320 are substantially identical to the connector 108 (see FIG. 4) and will not be separately described in detail.

The shell 324 comprises an upper shell panel 324A and a lower shell panel 324B both being formed from a conductive material and positioned substantially parallel to one another. In an exemplary embodiment, the upper and lower shell panels 324A and 324B are identical to one another. Each upper and lower shell panel 324A and 324B includes clips 340 positioned on each shell panel 324A and 324B so that when the upper and lower shell panels 324A and 324B are joined, corresponding clips 340 engage one another to latch the upper and lower shell panels 324A and 324B together forming the shell 324. Each shell panel 324A and 324B includes a recess in the form of an outwardly belled concave portion 344 that is provided to allow finger access to a memory card (not shown) in the connector 320.

An EMI shielding member 350 is formed on a forward perimeter 352 of each shell panel 324A and 324B proximate the opening 336. In an exemplary embodiment, the EMI shielding member 350 includes a plurality of flexible fingers 356 formed on the perimeter 352. In one embodiment, the flexible fingers 356 may be formed integrally with the shell panels 324A and 324B. In other embodiments, the flexible fingers 356 may be formed as a separate component that may be mounted on the perimeter 352 of the shell panels 324A and 324B. The forward perimeters 352 of the shell panels 324A and 324B and the flexible fingers 356 are configured to partially protrude through the opening 310 in the panel 304 such that the flexible fingers engage an edge 358 of the panel opening 310 to suppress the escape of EMI energy from inside the chassis (not shown) through the panel opening 310.

Figure 7:
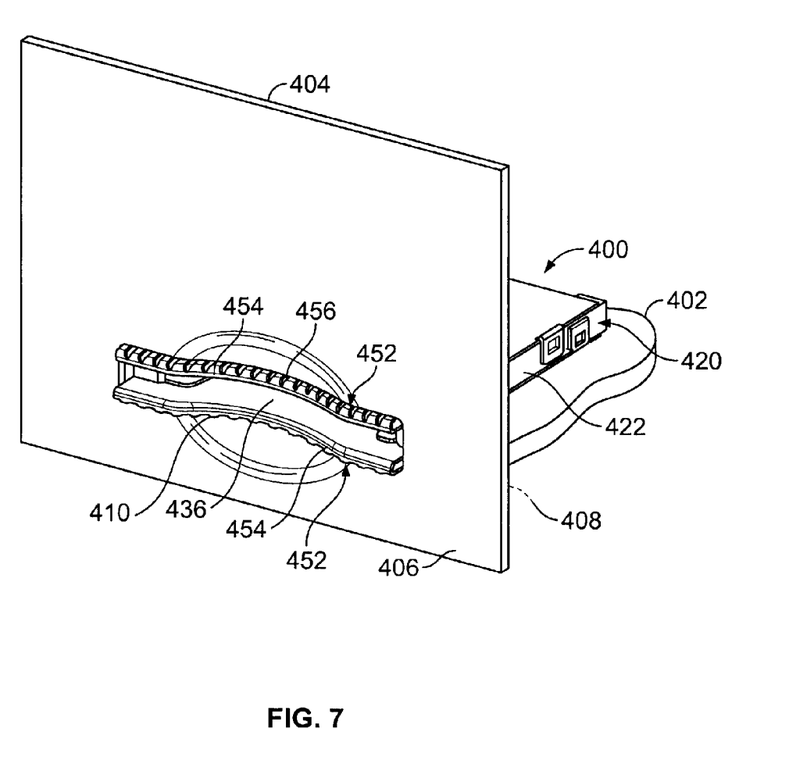
FIG. 7 is a perspective view a connector assembly formed in accordance with a second alternative embodiment of the present invention.
Figure 8:
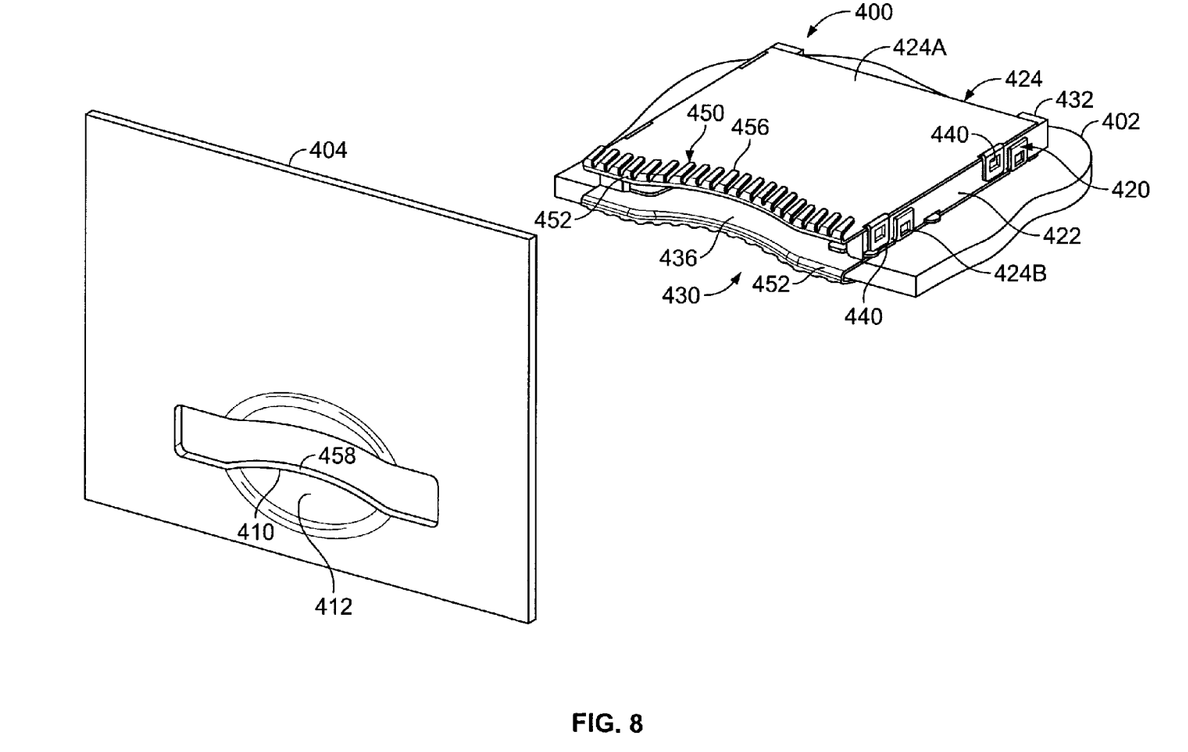
FIG. 8 is a perspective view of the connector assembly shown in FIG. 7 displaced from the panel.

FIG. 7 illustrates a perspective view a connector assembly 400 formed in accordance with a second alternative embodiment of the present invention. The connector assembly 400 is mounted on a circuit board 402 and is positioned adjacent a conductive panel 404. FIG. 8 illustrates a perspective view of the connector assembly 400 displaced from the panel 404. The panel 404 has an outer surface 406, an inner surface 408, and an opening 410 therethrough. A memory card (not shown) may be inserted into and extracted from the connector assembly 400 through the opening 410. The panel 404 also includes an indentation 412 at a central portion of the opening 410 that provides a recess for finger access to a memory card (not shown) in the connector 420. As with the previously described embodiments, the panel 404 may represent a wall of a chassis (not shown) within which the connector assembly 400 is installed.

The connector assembly 400 includes a connector 420 comprising a dielectric housing 422 that is held in a conductive shell 424. The housing 422 holds a plurality of electrical contacts (not shown) that electrically connect the connector 420 to the circuit board 402. The shell 424 is electrically connected to a ground plane (not shown) on the circuit board 402. The connector 420 includes a forward end 430 and a rearward end 432 opposite the forward end 430. An opening 436 proximate the forward end 430 is provided to receive a memory card (not shown). The opening 436 is at least partially defined by the shell 424. Other aspects of the connector 420 are substantially identical to the connector 108 (see FIG. 4) and will not be separately described in detail.

The shell 424 comprises an upper shell panel 424A and a lower shell panel 424B both being formed from a conductive material and positioned substantially parallel to one another. In an exemplary embodiment, the upper and lower shell panels 424A and 424B are identical to one another. Each upper and lower shell panel 424A and 424B includes clips 440 positioned on each shell panel 424A and 424B so that when the upper and lower shell panels 424A and 424B are joined, corresponding clips 440 engage one another to latch the upper and lower shell panels 424A and 424B together forming the shell 424.

An EMI shielding member 450 is formed on a forward perimeter 452 of each shell panel 424A and 424B proximate the opening 436. Each forward perimeter 452 is formed with an arcuate recess 454 that substantially conforms to the indentation 412 in the panel 404. In an exemplary embodiment, the EMI shielding member 450 includes a plurality of flexible fingers 456 formed on the perimeter 452. In one embodiment, the flexible fingers 456 may be formed integrally with the shell panels 424A and 424B. In other embodiments, the flexible fingers 456 may be formed as a separate component that may be mounted on the perimeter 452 of the shell panels 424A and 424B. The forward perimeters 452 of the shell panels 424A and 424B and the flexible fingers 456 are configured to partially protrude through the opening 410 in the panel 404 such that the flexible fingers 456 engage an edge 458 of the panel opening 410 to suppress the escape of EMI energy from inside the chassis (not shown) through the panel opening 410.

Figure 9:
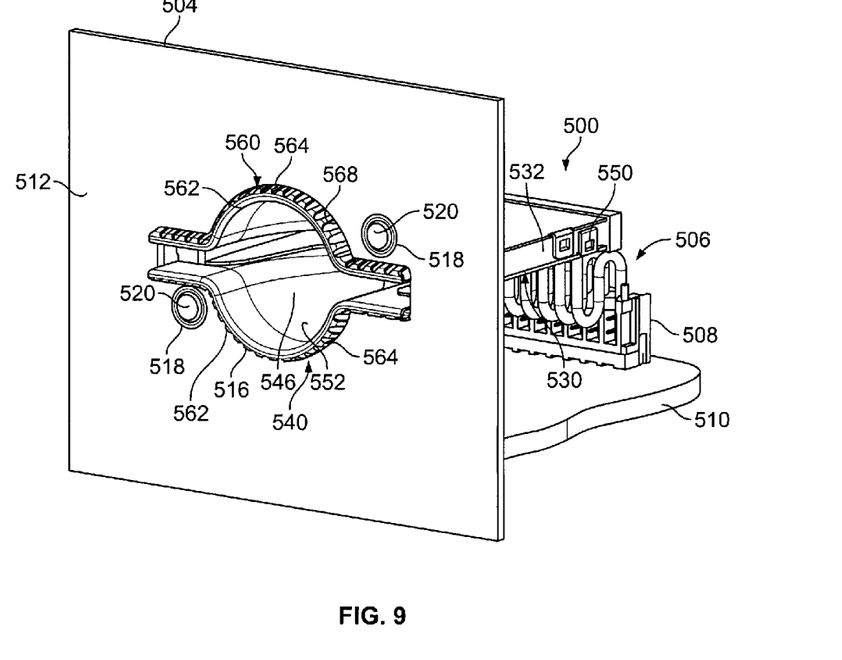
FIG. 9 is a front perspective view a connector assembly formed in accordance with a third alternative embodiment of the present invention.
Figure 10:
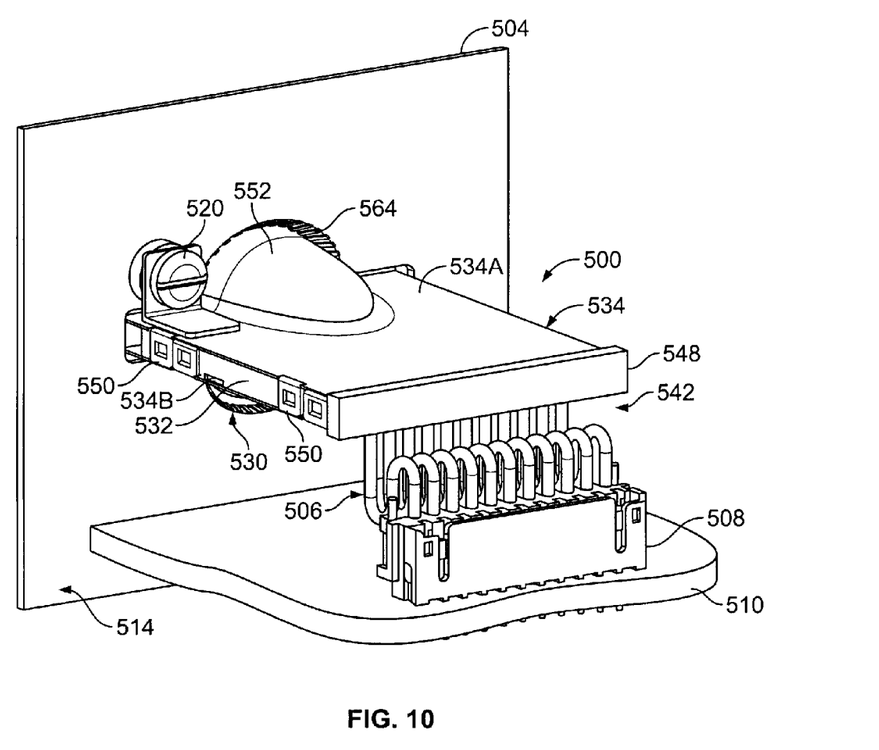
FIG. 10 is a rear perspective view of the connector assembly shown in FIG. 9.

FIG. 9 illustrates a front perspective view a connector assembly 500 formed in accordance with a third alternative embodiment of the present invention. FIG. 10 illustrates a rear perspective view of the connector assembly 500. The connector assembly 500 is a panel mount design and is mounted on a conductive panel 504. The connector assembly 500 includes a cable assembly 506 that is mated to a secondary connector 508 on a circuit board 510 to electrically connect the connector assembly 500 to the circuit board 510. The panel 504 has an outer surface 512, an inner surface 514, and an opening 516 therethrough. A memory card (not shown) may be inserted into and extracted from the connector assembly 500 through the opening 516. The panel 504 also includes mounting apertures 518 to facilitate mounting the connector assembly 500 on the panel 504. In one embodiment, the apertures 518 are threaded apertures configured to receive threaded fasteners 520 to mount the connector assembly 500 to the panel 504. As with the previously described embodiments, the panel 504 may represent a wall of a chassis (not shown) within which the connector assembly 500 is installed.

The connector assembly 500 includes a connector 530 comprising a dielectric housing 532 that is held in a conductive shell 534. In one embodiment, electrical continuity from the shell 534 to the circuit board 510 is provided by a ground lead in the cable assembly 506. The connector 530 includes a forward end 540 and a rearward end 542 opposite the forward end 540. An opening 546 proximate the forward end 540 is provided to receive a memory card (not shown). The opening 546 is at least partially defined by the shell 534. The connector 530 includes contacts (not shown) having mating ends proximate the rearward end 542 of the connector 530. The rearward end 542 of the connector 530 is configured to mate with a cable mounted connector 548 to thereby electrically connect the connector contacts with the cable assembly 506 and further to the circuit board 510. Other aspects of the connector 530 are substantially identical to the connector 108 (see FIG. 4) and will not be separately described in detail.

The shell 534 comprises an upper shell panel 534A and a lower shell panel 534B both being formed from a conductive material and positioned substantially parallel to one another. In an exemplary embodiment, the upper and lower shell panels 534A and 534B are identical to one another. Each upper and lower shell panel 534A and 534B includes clips 550 positioned on each shell panel 534A and 534B so that when the upper and lower shell panels 534A and 534B are joined, corresponding clips 550 engage one another to latch the upper and lower shell panels 534A and 534B together forming the shell 534. Each shell panel 534A and 534B includes a recess in the form of an outwardly belled concave portion 552 that is provided to allow finger access to a memory card (not shown) in the connector 530.

An EMI shielding member 560 is formed on a forward perimeter 562 of each shell panel 534A and 534B proximate the opening 546. In an exemplary embodiment, the EMI shielding member 560 includes a plurality of flexible fingers 564 formed on the perimeter 562. In one embodiment, the flexible fingers 564 may be formed integrally with the shell panels 534A and 534B. In other embodiments, the flexible fingers 564 may be formed as a separate component that may be mounted on the perimeter 562 of the shell panels 534A and 534B. The forward perimeters 562 of the shell panels 534A and 534B and the flexible fingers 564 are configured to partially protrude through the opening 516 in the panel 504 such that the flexible fingers 564 engage an edge 568 of the panel opening 516 to suppress the escape of EMI energy from inside the chassis (not shown) through the panel opening 516. The panel mounted connector assembly 500 facilitates saving space on the circuit board 510 and also facilitates minimizing air flow restrictions through the chassis (not shown).

The embodiments thus described provide a connector assembly that facilitates minimizing the escape of EMI energy from a chassis within which the connector assembly is mounted. The connector assembly offers particular advantages to secure digital (SD) applications due to size constraints associated with the SD form factor. The connector assembly includes a conductive shell with an integrally formed EMI shielding member that reduces the number of components in the connector assembly. The EMI shielding member includes a plurality of flexible fingers formed on a forward perimeter of the shell. The connector assembly provides a depression for finger access to the memory card. A panel mount option facilitates saving space on circuit boards.

Exemplary embodiments are described and/or illustrated herein in detail. The embodiments are not limited to the specific embodiments described herein, but rather, components and/or steps of each embodiment may be utilized independently and separately from other components and/or steps described herein. Each component, and/or each step of one embodiment, can also be used in combination with other components and/or steps of other embodiments. When introducing elements/components/etc. described and/or illustrated herein, the articles "a", "an", "the", "said", and "at least one" are intended to mean that there are one or more of the element(s)/component(s)/etc. The terms "comprising", "including" and "having" are intended to be inclusive and mean that there may be additional element(s)/component(s)/etc. other than the listed element(s)/component(s)/etc. Moreover, the terms "first," "second," and "third," etc. in the claims are used merely as labels, and are not intended to impose numerical requirements on their objects. Further, the limitations of the following claims are not written in means—plus-function format and are not intended to be interpreted based on 35 U.S.C. § 112, sixth paragraph, unless and until such claim limitations expressly use the phrase "means for" followed by a statement of function void of further structure.

While the invention has been described in terms of various specific embodiments, those skilled in the art will recognize that the invention can be practiced with modification within the spirit and scope of the claims.

What is claimed is:

1. A memory card connector assembly for use within a chassis, the connector assembly comprising:
   a conductive shell including an upper shell panel and a lower shell panel, each of the upper and lower shell panels having a forward perimeter;
   a connector positioned within said shell between the upper and lower shell panels, said connector comprising a dielectric ho using;
   an EMI shielding member disposed on said forward perimeters of said upper and lower shell panels, said EMI shielding members configured to engage a surface of a panel of the chassis to suppress the escape of EMI energy from the chassis, and
   wherein said shell includes a flange transversely protruding from at least one of said upper and lower shell panels and said EMI shielding member is positioned on a flange perimeter of said flange, and wherein said flange is configured for engagement with the panel of the chassis.

2. The memory card connector assembly of claim 1, wherein said lower shell panel joined to said upper shell panel.

3. The memory card connector assembly of claim 1, wherein said EMI shielding member comprises a plurality of flexible fingers.

4. The memory card connector assembly of claim 1, wherein said EMI shielding member is formed integrally with said shell.

5. The memory card connector assembly of claim 1, wherein a portion of said shell and a portion of said EMI shielding member are configured to partially protrude through an opening in the panel of the chassis.

6. The memory card connector assembly of claim 1, wherein said shell defines a recess for finger access to a memory card loaded into the connector between the upper and lower shell panels.

7. The memory card connector assembly of claim 1, wherein said EMI shielding member is configured to engage a rearward surface of the panel of the chassis.

8. A memory card connector assembly for use within a chassis, the connector assembly comprising:
   a conductive shell including an upper shell panel and a lower shell panel, each of the upper and lower shell panels having a forward perimeter;
   a connector positioned within said shell between the upper and lower shell panels, said connector comprising a dielectric housing having a memory card opening that is at least partially defined by said shell;
   an EMI shielding member disposed on at least one of said forward perimeters of said upper and lower shell panels, said EMI shielding member configured to engage a surface of a panel of the chassis to suppress the escape of EMI energy from the chassis, and
   wherein said shell includes a flange transversely protruding from at least one of said upper and lower shell panels and said EMI shielding member is positioned on a flange perimeter of said flange, and wherein said flange is configured for engagement with the panel of the chassis.

9. The memory card connector assembly of claim 1, wherein said upper and lower shell panels are positioned substantially parallel to one another.

10. The memory card connector assembly of claim 1, wherein at least one of said forward perimeters includes an arcuate recess configured to provide finger access to a memory card loaded into the connector.

11. The memory card connector assembly of claim 8, wherein said EMI shielding member is configured to engage an inner edge of an opening in the panel of the chassis.

12. The memory card connector assembly of claim 8, wherein said lower shell panel joined to said upper shell panel.

13. The memory card connector assembly of claim 8, wherein said EMI shielding member comprises a plurality of flexible fingers.

14. The memory card connector assembly of claim 8, wherein a portion of said shell and a portion of said EMI shielding member are configured to partially protrude through an opening in the panel of the chassis.

15. The memory card connector assembly of claim 8, wherein said shell defines a recess for finger access to a memory card loaded into the connector through the memory card opening.

16. The memory card connector assembly of claim 8, wherein said EMI shielding member is configured to engage a rearward surface of the panel of the chassis.

17. The memory card connector assembly of claim 8, wherein said upper and lower shell panels are positioned substantially parallel to one another.

18. The memory card connector assembly of claim 8, wherein at least one of said forward perimeters includes an arcuate recess configured to provide finger access to a memory card loaded into the memory card opening.

* * * * *